(12) United States Patent
Ono et al.

(10) Patent No.: US 7,541,643 B2
(45) Date of Patent: Jun. 2, 2009

(54) SEMICONDUCTOR DEVICE

(75) Inventors: Syotaro Ono, Yokohama (JP); Wataru Saito, Kawasaki (JP); Yusuke Kawaguchi, Hayama-machi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 11/399,448

(22) Filed: Apr. 7, 2006

(65) Prior Publication Data

US 2006/0231917 A1 Oct. 19, 2006

(30) Foreign Application Priority Data

Apr. 7, 2005 (JP) ............................. 2005-110594

(51) Int. Cl.
*H01L 29/76* (2006.01)
*H01L 29/94* (2006.01)
(52) U.S. Cl. ..................... 257/341; 257/342; 438/588
(58) Field of Classification Search ......... 257/341–342, 257/328, 335–337, E27.091, E27.095, E27.096, 257/E29.118, E29.274, E29.313
See application file for complete search history.

(56) References Cited

U.S. PATENT DOCUMENTS

| 6,674,126 B2 * | 1/2004 | Iwamoto et al. ............. 257/341 |
| 6,693,338 B2 | 2/2004 | Saitoh et al. |
| 6,870,201 B1 | 3/2005 | Deboy et al. |
| 6,888,195 B2 | 5/2005 | Saito et al. |
| 6,995,426 B2 | 2/2006 | Okumura et al. |
| 7,091,556 B2 * | 8/2006 | Edwards et al. ............. 257/336 |

FOREIGN PATENT DOCUMENTS

| JP | 2001-135819 | 5/2001 |
| JP | 2003-124465 | 4/2003 |
| JP | 2003-204065 | 7/2003 |
| JP | 2004-22716 | 1/2004 |

OTHER PUBLICATIONS

U.S. Appl. No. 11/399,448, filed Apr. 7, 2006, Ono, et al.

* cited by examiner

*Primary Examiner*—Theresa T Doan
(74) *Attorney, Agent, or Firm*—Oblon, Spivak, McClelland, Maier & Neustadt, P.C.

(57) ABSTRACT

This semiconductor device comprises a pillar layer including a first semiconductor pillar layer of a first conductivity type and a second semiconductor pillar layer of a second conductivity type formed alternately on a first semiconductor layer. At the same depth position in the device region and the end region, a difference between an impurity concentration [cm-3] of the second semiconductor pillar layer in the device region and that of the second semiconductor pillar layer in the end region is less than plus or minus 5%. A width W11 [um] of the first semiconductor pillar layer in the device region, a width W21 [um] of the second semiconductor pillar layer in the device region, a width W12 [um] of the first semiconductor pillar layer in the end region, and a width W22 [um] of the second semiconductor pillar layer in the end region, meet the relationship of W21/W11<W22/W12.

18 Claims, 2 Drawing Sheets

SEMICONDUCTOR DEVICE

CROSS-REFERENCE TO RELATED APPLICATION

This application is based upon and claims the benefit of priorities from the prior Japanese Patent Applications No. 2005-110594, filed on Apr. 7, 2005 the entire content of which is incorporated herein by reference.

BACKGROUND OF THE INVENTION

1. Field of the Invention

The present invention relates to a semiconductor device, more particularly, a semiconductor device with a so-called Super Junction structure.

2. Description of the Related Art

In a vertical type power MOSFET, its on-resistance highly depends on electric resistance at its conduction layer (a drift layer). The electric resistance of the drift layer is determined by its impurity concentration. Therefore, the on-resistance may be lowered when the impurity concentration is set higher.

However, when the impurity concentration becomes higher, the breakdown voltage of a PN junction formed by the drift layer and a base layer decreases. Thus, the impurity concentration cannot be increased to be larger than the limit determined by the breakdown voltage. As described above, there exists a trade-off relationship between the device breakdown voltage and the on-resistance. Improving this trade-off is a critical issue on providing power semiconductor devices with a low electric consumption. This trade-off has a limit determined by the material of the device. Exceeding this limit is a way to the realization of power semiconductor devices with a low on-resistance.

As an example of a MOSFET for a solution to this problem, a structure called Super Junction structure is known (for example, see JP-A 2001-135819). The structure includes a p-type pillar layer and an n-type pillar layer with a longitudinal stripe shape arranged alternately in a lateral direction. The Super Junction structure virtually makes up a non-doped layer by equalizing the amount of impurity included in the p-type pillar layer and the n-type pillar layer. Therefore, low on-resistance exceeding the material limit can be realized by flowing a current through a highly doped n-type pillar layer while sustaining a high breakdown voltage.

In this MOSFET with a Super Junction structure, fluctuation of the impurity concentration in these semiconductor pillar layers greatly affects on an on-resistance and a breakdown voltage property. Additionally, compared to the breakdown voltage in a device region where a MOSFET is formed, the breakdown voltage in an end region surrounding the device region must be set higher. Otherwise a breakdown voltage in the whole semiconductor device is determined by that in the end region. In this case, high avalanche withstanding capability cannot be obtained.

SUMMARY OF THE INVENTION

In one aspect the present invention provides a semiconductor device comprising: a first semiconductor layer of a first conductivity type; a pillar layer including a first semiconductor pillar layer of a first conductivity type and a second semiconductor pillar layer of a second conductivity type, said first and second semiconductor pillar layers formed alternately on said first semiconductor layer along a direction of a surface of said first semiconductor layer; a first main electrode electrically connected to said first semiconductor layer; a semiconductor base layer of a second conductivity type formed on a surface of said pillar layer; a semiconductor diffusion layer of a first conductivity type formed selectively on a surface of said semiconductor base layer; a second main electrode formed to have a junction with said semiconductor base layer and said semiconductor diffusion layer; and a control electrode formed via an insulating film in a area ranging from said semiconductor diffusion layer to said first semiconductor pillar layer to form a channel between said semiconductor diffusion layer and said first semiconductor pillar layer; wherein said pillar layer is formed not only in a device region but also in an end region outside said device region; wherein at the same depth position in said device region and said end region, a difference between an impurity concentration [cm-3] of said second semiconductor pillar layer in said device region and that of said second semiconductor pillar layer in said end region is less than plus or minus 5%; and wherein a width W11 [um] of said first semiconductor pillar layer in said device region, a width W21 [um] of said second semiconductor pillar layer in said device region, a width W12 [um] of said first semiconductor pillar layer in said end region, and a width W22 [um] of said second semiconductor pillar layer in said end region, meets the relationship of W21/W11<W22/W12.

In one aspect the present invention provides a semiconductor device comprising: a first semiconductor layer of a first conductivity type; a pillar layer including a first semiconductor pillar layer of a first conductivity type and a second semiconductor pillar layer of a second conductivity type, said first and second semiconductor pillar layers formed alternately on said first semiconductor layer along a direction of a surface of said first semiconductor layer; a first main electrode electrically connected to said first semiconductor layer; a semiconductor base layer of a second conductivity type formed on a surface of said pillar layer; a semiconductor diffusion layer of a first conductivity type formed selectively on a surface of said semiconductor base layer; a second main electrode formed to have a junction with said semiconductor base layer and said semiconductor diffusion layer; and a control electrode formed via an insulating film in a area ranging from said semiconductor diffusion layer to said first semiconductor pillar layer to form a channel between said semiconductor diffusion layer and said first semiconductor pillar layer; wherein said pillar layer is formed not only in a device region but also in an end region outside said device region; and wherein at the same depth position in said device region and said end region, an impurity dose amount Q11 [cm-2] to said first semiconductor pillar layer in said device region, an impurity dose amount Q21 [cm-2] to said second semiconductor pillar layer in said device region, an impurity dose amount Q12 [cm-2] to said first semiconductor pillar layer in said end region, and an impurity dose amount Q22 [cm-2] to said second semiconductor pillar layer in said end region, meet the relationship of Q21/Q11<Q22/Q12.

DETAILED DESCRIPTION OF THE INVENTION

Figure 3:
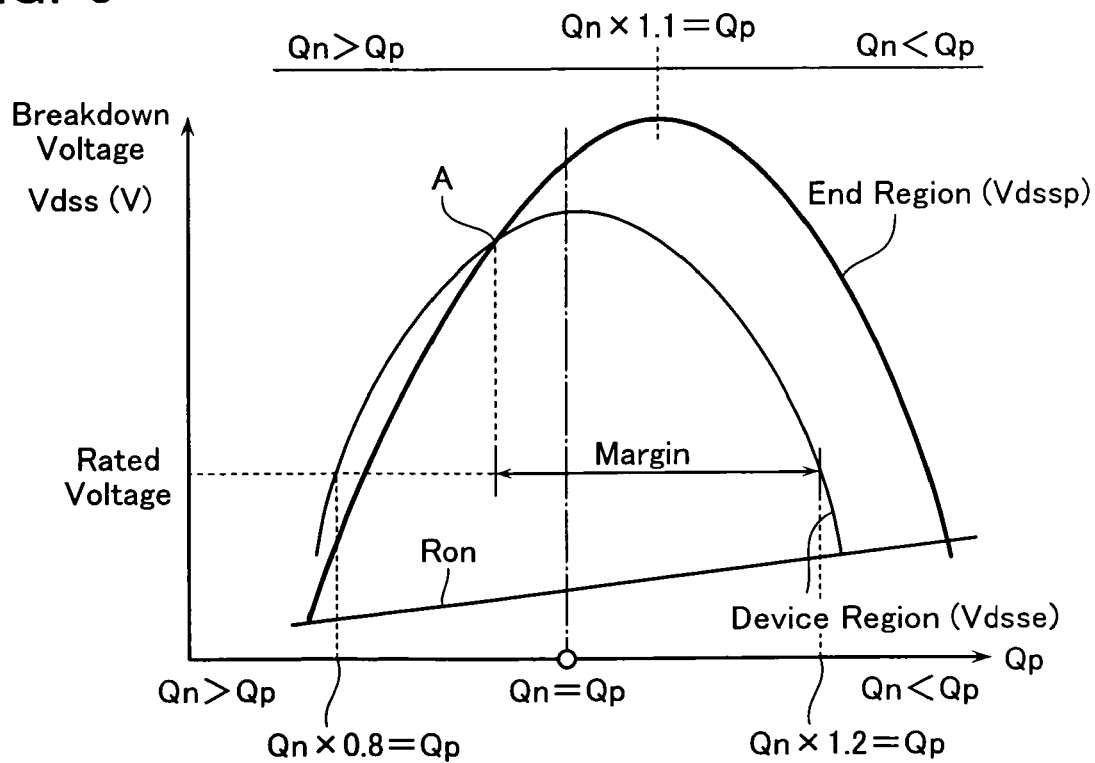
FIG. 3 illustrate a comparative example of a curve showing a variation of a breakdown voltage Vdssp in an end region of a power MOSFET, and that of a breakdown voltage Vdsse in a device region thereof.

As described above, in the above-mentioned MOSFET with a Super Junction structure, fluctuation of the impurity concentration in these semiconductor pillar layers highly affects on the on-resistance and the breakdown voltage property. FIG. 3 shows a relationship between a impurity dose amount (cm-2) Qp in an p-type semiconductor pillar layer, and a non-resistance Ron or a breakdown voltage Vdsse. The impurity dose amount in the n-type pillar layer is defined by Qn (cm-2), and the impurity dose amount in the p-type pillar layer is defined by Qp (cm-2). When Qn=Qp, a charge balance between both p-type and n-type pillar layers is established, which maximizes the breakdown voltage Vdsse. Either in the case of Qn>Qp, or in the case of Qn<Qp, the breakdown voltage Vdsse lowers compared to that when Qn=Qp. When the impurity dose amount Qp becomes relatively larger than Qn, the on-resistance becomes larger.

The explanation above is about a breakdown voltage Vdsse in a device region. A curve of a breakdown voltage Vdssp in an end region outside the device region is different from that of the breakdown voltage Vdsse in the device region. The breakdown voltage Vdssp in the end region is set larger than the breakdown voltage Vdsse in the device region (Vdssp>Vdsse). Otherwise, the breakdown voltage in the whole semiconductor device is determined by the breakdown voltage Vdssp in the end region, not by the breakdown voltage Vdsse in the device region. Additionally, since an avalanche current concentrates in the end region only, high avalanche withstanding capability cannot be obtained, which causes device destruction.

By the way, in a N-channel MOSFET, maximum value of the breakdown voltage Vdssp is obtained in the case of Qp>Qn, not in the case of Qn=Qp (see FIG. 3). In FIG. 3, the maximum value of the Vdssp is obtained when Qp=Qn×1.1. That is, the variation curve of the breakdown voltage Vdssp has its peak position (a position of the maximum value) shifted compared to that of the breakdown voltage Vdsse. However, in spite of this, it is normal to set the impurity dose amount so that Qn is equal to Qp even in the end region. Because of the shift, the area where the breakdown voltage Vdssp in the end region is larger than the breakdown voltage Vdsse in the device region and the rated voltage of the MOSFET can be obtained (a margin) becomes narrow. This will be explained with reference to FIG. 3. When the Qn=Qp is set as a set value, the breakdown voltage Vdsse in the device region is equal to or larger than the rated voltage in the area from Qp=0.8×Qn to Qp=1.2×Qn, even if a fluctuation of the impurity dose amount of plus or minus 20% occurs. In the minus direction (Qn>Qp), however, in the point A which is closer than the point of Qp=0.8×Qn, the breakdown voltage Vdssp becomes smaller than the voltage Vdsse. As explained above, when a fluctuation of the impurity dose amount occurs from a set value during the process of forming pillar layers or the like, the breakdown voltage Vdssp in the end region often becomes lower than the breakdown voltage Vdsse in the device region. Therefore, MOSFETs meeting a required property cannot be obtained with a high yield. Since it is not always easy to control the impurity dose amount correctly using the present semiconductor manufacturing technologies, it is desirable to set the margin large to some extent.

Figure 1:
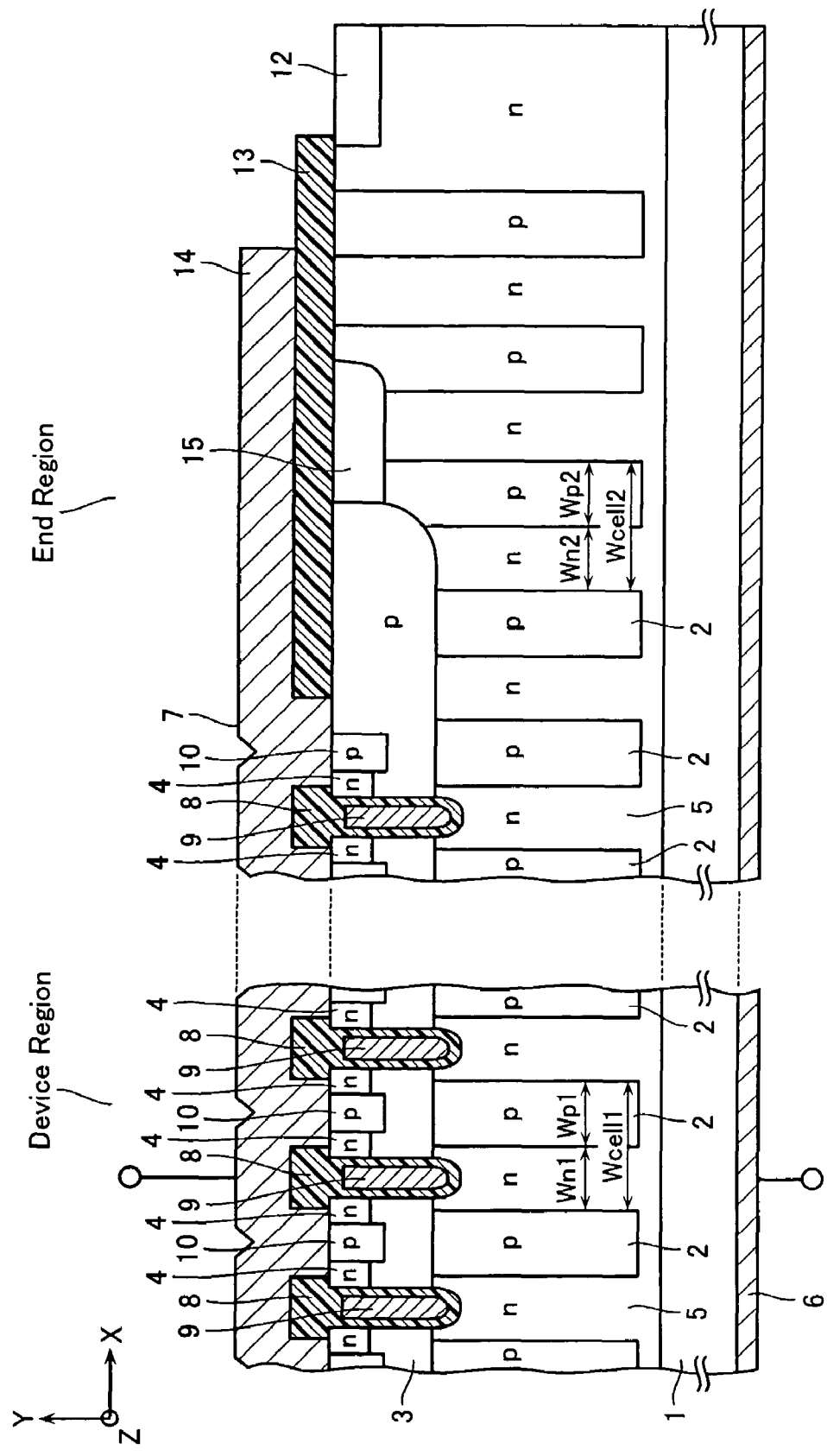
FIG. 1 is a cross-sectional view schematically illustrating a structure of a power MOS transistor according to an embodiment of the present invention.

The embodiments of the present invention will now be described in detail with reference to the drawings. FIG. 1 is a cross-sectional view schematically illustrating a structure of a power MOS transistor according to the first embodiment of the present invention. This MOSFET has an n+ type substrate 1 serving as a drain layer. On the n+ type substrate 1, an n-type pillar layer 5 and a p-type pillar layer 2, whose sectional shapes are of a longitudinal stripe, are alternately arranged in a lateral direction (a first direction) along a surface of the n+ type substrate 1, to form a Super Junction structure. The Super Junction structure is formed not only in the device region where the MOSFETs are formed, but also in the end region outside of the device region.

A drain electrode 6 is formed under the n+ type substrate 1 common to a plurality of MOSFET cells. Note that the bottom part of the p-type pillar layer 2 does not contact the n+ type substrate 1. A part of the n-type pillar layer 5 exists between the bottom part of the p-type pillar layer 2 and the n+ type substrate 1. It is also possible to make the bottom part of the p-type pillar layer 2 to contact the n+ type substrate 1.

A p-type base layer 3 is formed on the surface of the Super junction structure. In addition, a n-type source diffusion layer 4 is selectively formed in the surface of the p-type base layer 3 to have a stripe shape. The p-type base layer 3 is formed not only in the device region but also partly formed extending in the end region to improve the breakdown voltage property. Furthermore, a gate electrode 9 is formed via a gate insulating film 8. It has a vertical direction (Y direction) as a longer direction. The gate electrode 9 penetrates the p-type base layer 3 from the side position of the n-type source diffusion layer 4 to reach the n-type pillar layer 5. The gate electrode 9 makes the MOSFETs turn on, when it is given an gate voltage of the threshold voltage or more, by forming a channel extending vertically in the p-type base layer 3.

On the p-type base layer 3 and the n-type source diffusion layer 4, a source electrode 7 is connected common to each of the MOSFETS. The source electrode 7 is insulated from the gate electrode 9 by the gate insulating film 8 and the like. Note that a p-type contact layer 10 is formed between the source electrode 7 and the p-type base layer 3 in order to reduce a contact resistance. A field plate electrode 14 is formed above the n-type pillar layer 5 and the p-type pillar layer 2 in the end region via an insulating film 13. The field plate electrode 14 is connected to the source electrode 7 or the gate electrode 9. When the MOSFETS are turned off and the drain voltage is elevated, the field plate electrode 14 serves to extend a depletion layer to a lateral direction, with a p-type Resurf layer 15 having an impurity concentration lower than that in the p-type base layer 3, to alleviate the electric field applied to the edge of the p-type base layer 3 to raise the breakdown voltage.

The p-type Resurf layer 15 is formed on the surface of the Super Junction structure in the part of the end region. It also serves to extend a depletion layer to a lateral direction when the MOSFETs are turned off.

Hereinbelow, a width (a width in the direction where pn pillars are alternately formed (x direction)) of one n-type pillar layer 5 in the device region at the depth D is defined as Wn1. A width of one p-type pillar layer 2 in the device region at the depth D is defined as Wp1. A cell pitch (a total width) of the Super Junction structure at the depth D in the device region is defined as Wcell1 (=Wn1+Wp1). A width of one n-type pillar layer 5 in the end region at the depth D is defined as Wn2. A width of one p-type pillar layer 2 in the end region at the depth D is defined as Wp2. A cell pitch of the Super Junction structure at the depth D in the end region is defined as Wcell2 (=Wn2+Wp2). In this case, the p-type pillar layer 2 and the n-type pillar layer 5 are formed so that the following formula applies.

$$Wp1/Wn1 < Wp2/Wn2 \quad \text{[Formula 1]}$$

Preferably, it is preferable that the following formula applies.

$$Wp2 > wp1, \text{ and}$$

$$Wcell1 = Wcell2 \quad \text{[Formula 2]}$$

That is, while the cell pitches Wcell are made substantially equal between the device region and the end region at the same depth, the width Wp2 of the p-type pillar layer 2 in the end region may be made larger than the width Wp1 of the p-type pillar layer 2 in the device region at the same depth. It can also meet the relationship of [Formula 1]. Note here that when the difference between the cell pitches Wcell1 and Wcell2 is smaller than plus or minus 5%, the both may be deemed as substantially same considering the measurement error of a measuring instrument, and it may be recognized that Wcell1=Wcell2 applies.

Figure 2:
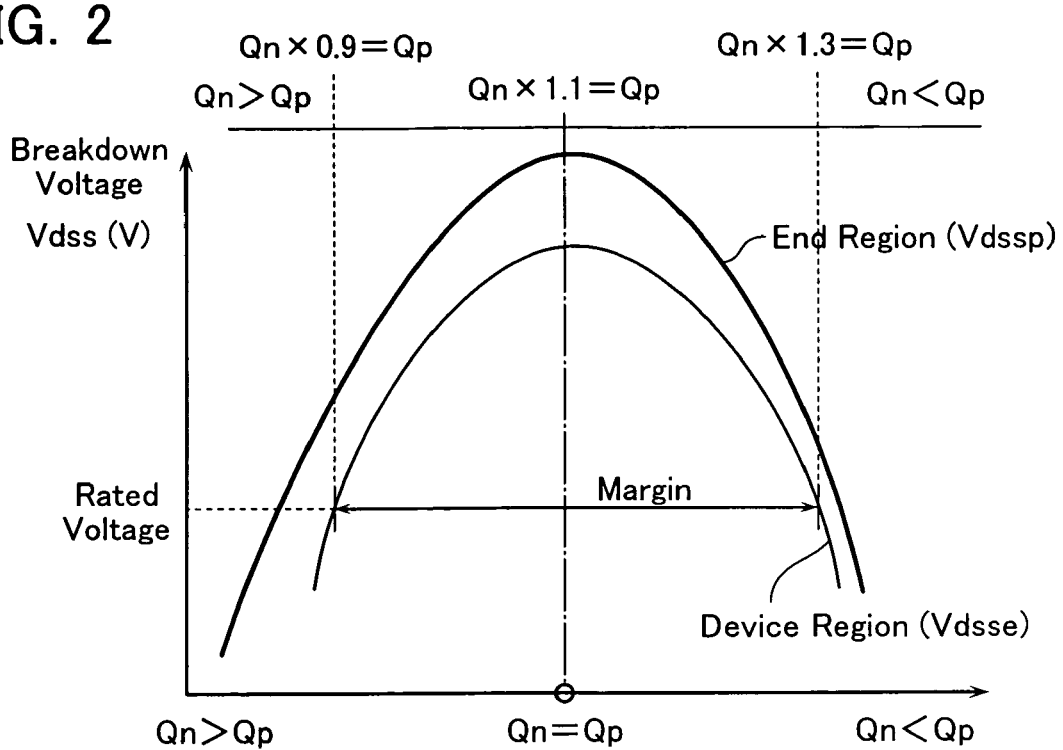
FIG. 2 shows an example of a curve showing a variation of a breakdown voltage Vdssp in an end region of a power MOSFET according to the embodiment, and that of a breakdown voltage Vdsse in a device region thereof.

When the relationship of [Formula 1] and [Formula 2] applies, it is possible to make the peak of the curve showing the variation of the breakdown voltage Vdssp in the end region bring closer to that of the curve showing the variation of the breakdown voltage Vdsse in the device region, compared to the comparative example (FIG. 3), as shown in FIG. 2. Note that the lower lateral axis of the graph shown in FIG. 2 illustrates a magnitude relationship of impurity dose amounts in the p-type pillar layer 2 and the n-type pillar layer 5 in the device region, and the upper lateral axis illustrates a magnitude relationship of impurity dose amounts in the p-type pillar layer 2 and the n-type pillar layer 5 in the end region. Specifically, in the case of Qn=Qp, the variation curve of the breakdown voltage Vdsse in the device region comes to its peak. In that case, by meeting the relationship of [Formula 1], and preferably of [Formula 2], a standard value of the impurity dose amount can be set so that the variation curve of the breakdown voltage Vdssp in the end region may have a peak close to that of the variation curve of the breakdown voltage Vdsse in the device region.

Setting the width Wp and Wn properly enables the both peaks positioned almost at same positions. Therefore, the area where the rated voltage of the MOSFET can be obtained and the breakdown voltage Vdssp in the end region is larger than the breakdown voltage Vdsse in the device region (a margin) can be larger compared to the comparative example shown in FIG. 3. In that case, MOSFETs meeting a required property may be obtained with a high yield, even if a fluctuation of the impurity dose amounts in the manufacturing process occurs to some extent. In the example of FIG. 2, the peak position of the breakdown voltage Vdssp in the end region and that of the breakdown voltage Vdsse in the device region almost coincide to each other, and the both curves do not cross each other. Therefore, since the margin is not affected by the breakdown voltage Vdssp, the margin may be larger.

Generally speaking, on forming a p-type pillar layer 2 and a n-type pillar layer 5 in a Super Junction structure, setting different impurity concentrations [cm-3] in the device region and the end region increases the production cost because of the increase in the number of the process steps.

However, with the above-mentioned method, an ideal state as shown in FIG. 2 (the device region is set to a condition of Qn=Qp and the end region is set to a condition of Qn>Qp) may be provided without increasing the number of the process steps, while the impurity concentration [cm-3] of the p-type pillar layer 2 may be almost the same in both of the device region and the end region. Note here that the impurity concentration of the p-type pillar layer 2 in the device region and that of the p-type pillar layer 2 in the end region may be deemed as almost the same, if the difference between them is less than plus or minus 5%, considering a measurement error in a measuring instrument.

As a specific example, in the case where Wn1=wp1=6.0 um, Wcell1=Wcell2=12.0 um, by setting Wp2 at 1.05 times or more of the Wn2 (for example, Wp2=6.3 um, Wn2=5.7 um), the relationship of [Formula 1] and [Formula 2] can be obtained, and it is possible to bring the peak of the curve showing the variation of the breakdown voltage Vdssp in the end region closer to that of the curve showing the variation of the breakdown voltage Vdsse in the device region, compared to the comparative example (FIG. 3). An ion injection process performed as a process for forming the pillar layer 2 and 5, can be performed with an error of plus or minus 0.1 um for a width of 6.0 um, that is, an error of approximately plus or minus 2%. Therefore, by setting a width of the pillar layers so that the relationship of Wp2>=Wn2×1.05 is obtained, the relationship of [Formula 1] and [Formula 2] can be obtained for certain.

The width of the each pillar layer 2 or 5 can be measured by following examples. For example, using a scanning capacitance microscope, a distribution of the electrostatic capacitance between the probe and a sample may be measured. Then, the distribution of impurities can be specified, and the width of the pillar layers can be measured. Alternatively, it may be measured using SIMS device (Secondary Ion Mass Stereoscopy). Specifically, p-type dopant amount and n-type dopant amount may be measured by the device, and the position where the both dopant amounts become equal can be judged as a boundary position of the pn junction. With this method, the width of the pillar layers can be measured. With this measuring method, it is also possible to measure an impurity concentration [cm-3] of the dopant included in each of the pillars 2 and 5. Furthermore, by integrating this, it is also possible to measure an impurity dose amount [cm-2] of each pillar layer 2 or 5.

Note that if the widths Wp1, Wn1, Wp2, Wn2 of the pillar layers 2 and 5 change in the depth direction (up-down direction), the average values thereof may meet the [Formula 1] and [Formula 2].

A power MOSFET according to the second embodiment of the present invention will be explained next. The power MOSFET according to the embodiment is different from the first embodiment in size or the like of the Super Junction structure. Since the other parts are the same as the first embodiment, the explanation will be done with reference to FIG. 1.

In this embodiment, the widths of the n-type pillar layer 5 and the p-type pillar layer 2 may be almost the same in the device region and the end region. Note that if the difference between both is less than plus or minus 5%, the both may be deemed as substantially the same. Instead, in the case where an impurity dose amount [cm-2] to the n-type pillar layer 5 in the device region is defined as Qn1, an impurity dose amount [cm-2] to the p-type pillar layer 2 in the device region is defined as Qp1, an impurity dose amount [cm-2] to the n-type pillar layer 5 in the end region is defined as Qn2, and an impurity dose amount [cm-2] to the p-type pillar layer 2 in the end region is defined as Qp2, the impurity dose amounts may be controlled to meet the following formula.

$$Qp1/Qn1 < Qp2/Qn2 \quad \text{[Formula 3]}$$

For example, by controlling the impurity dose amounts so that relationship of Qp2>Qn2 is obtained while keeping Qp1=Qn1, the relationship of [Formula 3] may be obtained.

In this case, by controlling the impurity dose amounts so that relationship of Qp2>1.10×Qn2 is obtained while keeping Qp1=Qn1, considering an error in the impurity injection process, the relationship of [Formula 3] may be obtained for certain.

Note that in the end region, its impurity dose amounts in its entirety can be set smaller compared to the device region. Thereby, higher breakdown voltage may be obtained, and as a result, the area where the breakdown voltage Vdssp in the end region is larger than the breakdown voltage Vdsse in the device region (a margin) becomes larger. For example, in the case where the impurity dose amounts are set to be Qn1=Qp1=X in the device region, impurity dose amounts Qp2 and Qn2 in the end region may be set at smaller values compared to those in the device region. For example, they can be set to approximately Qn2=X/2, and Qp2=1.1X/2. Thereby the relationship of [Formula 3] may be obtained, and a larger margin may be obtained. With these arrangements, the peak of the curve of the breakdown voltage Vdssp in the end region becomes higher compared to the case where the impurity dose amounts are almost equal between the device region and the end region. In addition, the broadening of the curve of the breakdown voltage Vdssp becomes larger (in other words, the gradient of the curve becomes smaller). Therefore, the margin becomes larger.

In the above explanation, description has been made to the case where an n-type pillar layer 5 and a p-type pillar layer 2, whose sectional shapes are of a longitudinal stripe, are alternately arranged on the n+ type substrate 1 in FIG. 1 which serves as a drain layer, in a lateral direction (a first direction) along a surface of the n+ type substrate 1.

In the direction perpendicular to the paper plane (the second direction) for example, there exists an end region where the n-type pillar layer 5 and the p-type pillar layer 2 extend in parallel. In this second direction, a depletion layer tends to extend compared to the first direction, and higher breakdown voltage may be obtained, because the p-type pillar layer 2 is connected to the p-type base layer 3. Therefore, the advantage of the present invention is prominent especially in the first direction shown in FIG. 1.

Although the description has been given with respect to the embodiments of the present invention, the present invention is not limited to those embodiments. Various types of modifications, additions, deletions, or replacements may be applied without departing from the scope of the present invention. For example, in the above-described embodiments, descriptions are made to the MOSFETs with a trench-gate structure. But the present invention may apply to MOSFETs with a planar gate structure. Alternatively, it is also possible to form a guard ring layer instead of forming the field plate electrode 14. It is also possible to obtain the same advantage if the p-type Resurf layer 15 shown in FIG. 1 is not formed.

Furthermore, even if impurity concentration in the p-type pillar layer 2 and the n-type pillar layer 2 becomes different in the depth direction, it is also possible to control the impurity concentration so that the above formulas applies in each position in the depth direction.

What is claimed is:

1. A semiconductor device, comprising:
   a first semiconductor layer of a first conductivity type;
   a pillar layer including a first semiconductor pillar layer of a first conductivity type and a second semiconductor pillar layer of a second conductivity type, said first and second semiconductor pillar layers formed alternately on said first semiconductor layer along a direction of a surface of said first semiconductor layer;
   a first main electrode electrically connected to said first semiconductor layer;
   a semiconductor base layer of a second conductivity type formed on a surface of said pillar layer;
   a semiconductor diffusion layer of a first conductivity type formed selectively on a surface of said semiconductor base layer;
   a second main electrode formed to have a junction with said semiconductor base layer and said semiconductor diffusion layer; and
   a control electrode formed via an insulating film in an area ranging from said semiconductor diffusion layer to said first semiconductor pillar layer to form a channel between said semiconductor diffusion layer and said first semiconductor pillar layer;
   wherein said pillar layer is formed not only in a device region but also in an end region outside said device region; and
   wherein at the same depth position in said device region and said end region, an impurity dose amount Q11 [cm-2] to said first semiconductor pillar layer in said device region, an impurity dose amount Q21 [cm-2] to said second semiconductor pillar layer in said device region, an impurity dose amount Q12 [cm-2] to said first semiconductor pillar layer in said end region, and an impurity dose amount Q22 [cm-2] to said second semiconductor pillar layer in said end region, meet the relationship of Q21/Q11<Q22/Q12.

2. A semiconductor device according to claim 1, wherein said impurity dose amount Q22 [cm-2] to said second semiconductor pillar layer in said end region is larger than said impurity dose amount Q21 [cm-2] to said second semiconductor pillar layer in said device region.

3. A semiconductor device according to claim 1, wherein said impurity dose amounts Q11, Q21, Q12 and Q22 are those measured by specifying impurity distribution in said semiconductor pillar layers.

4. A semiconductor device according to claim 3, wherein said impurity distribution is specified using a scanning capacitance microscope, and by measuring a distribution of the electrostatic capacitance between its probe and a sample.

5. A semiconductor device according to claim 1, wherein said impurity dose amounts Q11, Q21, Q12 and Q22 are those measured by measuring a dopant amount of a first conductivity type and a dopant amount of a second conductivity type in said semiconductor pillar layers, and by specifying the position where both of said dopant amounts become equal as a boundary position between said first and second semiconductor pillar layers.

6. A semiconductor device according to claim 5, wherein said dopant amount is measured by a SIMS device (Secondary Ion Mass Spectroscopy).

7. A semiconductor device according to claim 1, wherein said impurity dose amounts Q22 and Q21 are determined to be Q22>=1.10× Q21.

8. A semiconductor device according to claim 1, wherein a difference between a width of said first semiconductor pillar layer and that of said second semiconductor pillar layer is less than plus or minus 5%, in said device region and said end region.

9. A semiconductor device according to claim 1, wherein at the same depth position in said device region and said end region, a difference between an impurity concentration [cm-2] of said second semiconductor pillar layer in said device region and that of said second semiconductor pillar layer in said end region is less than plus or minus 5%; and wherein an average values W11ave, W21ave, W12ave, and W22ave of a width W11 [um] of said first semiconductor pillar layer in said device region, a width W21 [um] of said second semiconductor pillar layer in said device region, a width W12 [um] of said first semiconductor pillar layer in said end region, and a width W22 [um] of said second semiconductor pillar layer in said end region, respectively, meet the relationship of W21ave/W11ave<W22ave/W12ave.

10. A semiconductor device according to claim 9, wherein a difference between a average total width of said first and second semiconductor pillar layers along said first direction in said device region, and that of said first and second semiconductor pillar layers along said first direction in said end region is less than plus or minus 5%.

11. A semiconductor device according to claim 9, wherein a difference between a total width of said first and second semiconductor pillar layers along said first direction in said device region, and that of said first and second semiconductor pillar layers along said first direction in said end region is less than plus or minus 5%.

12. A semiconductor device according to claim 11, wherein said width W22 [um] of said second semiconductor pillar layer is said end region is larger than said width W21 [um] of said second semiconductor pillar layer in said device region.

13. A semiconductor device according the claim 1, wherein at the same depth position in said device region and said end region, a difference between an impurity concentration [cm-3] of said second semiconductor pillar layer in said device region and that of said second semiconductor pillar layer in said end region is less than plus or minus 5%; and wherein a width W11 [um] of said first semiconductor pillar layer in said device region, a width W21 [um] of said second semiconductor pillar layer in said device region, a width W12 [um] of said first semiconductor pillar layer in said end region, and a width W22 [um] of said second semiconductor pillar layer in said end region, meets the relationship of W21/W11<W22/W12.

14. A semiconductor device according to claim 13, wherein said widths W11, W21, W12 and W22 are measured by specifying impurity distributions in said semiconductor pillar layers.

15. A semiconductor device according to claim 14, wherein said impurity distribution is specified using a scanning capacitance microscope, and by measuring a distribution of the electrostatic capacitance between its probe and a sample.

16. A semiconductor device according to claim 13, wherein said widths W11, W21, W12 and W22 are measured by measuring a dopant amount of a first conductivity type and a dopant amount of a second conductivity type in said semiconductor pillar layers, and by specifying the position where both of said dopant amounts become equal as a boundary position between said first and second semiconductor pillar layers.

17. A semiconductor device according to claim 16, wherein said dopant amount is measured by a Secondary Ion Mass Spectroscopy (SIMS) device.

18. A semiconductor device according to claim 13, wherein a difference between a total width of said first and second semiconductor pillar layers along said first direction in said device region, and that of said first and second semiconductor pillar layers along said first direction in said end region is less than plus or minus 5%, and wherein said width W22 is set to be 1.05 times or more of said width W12.

* * * * *